United States Patent [19]

Chang

[11] 4,067,002
[45] Jan. 3, 1978

[54] FIELD ACCESS OF BUBBLE DOMAIN LATTICE

[75] Inventor: Hsu Chang, Yorktown Heights, N.Y.

[73] Assignee: International Business Machines Corporation, Armonk, N.Y.

[21] Appl. No.: 645,594

[22] Filed: Dec. 31, 1975

[51] Int. Cl.² .............................................. G11C 19/08
[52] U.S. Cl. .......................................... 365/43; 365/3
[58] Field of Search ................................. 340/174 TF

[56] References Cited

U.S. PATENT DOCUMENTS 3,994,842  3/1976  Dorleijn et al. ............... 340/174 TF

*Primary Examiner*—James W. Moffitt
*Attorney, Agent, or Firm*—Jackson E. Stanland

[57] ABSTRACT

Propagation of a lattice of magnetic bubble domains by field access techniques is achieved by using a periodic array of magnetic chevron elements. In response to the reorientation of a magnetic drive field in the plane of the chevron elements, magnetic poles are established to directly drive the lattice bubble domains. Those lattice domains not directly driven by magnetic poles are driven by repulsive forces within the lattice, such as those due to bubble-bubble interactions. The chevron arrays are designed to conform to the bubble lattice framework and patterns are established in which multiple bubble domains are associated with each chevron. The chevron elements can be symmetrical elements or skewed elements, and patterns are provided which can be used to drive multiple rows or columns of bubbles per chevron row or column. Generally, bubble domains alternate between being directly driven by magnetic poles along the chevrons and being indirectly driven by repulsive forces in the lattice. The exception to this is the array of extremely skewed and densely packed chevron elements where the directly driven bubble domains remain directly driven during all cycles of propagation.

24 Claims, 17 Drawing Figures

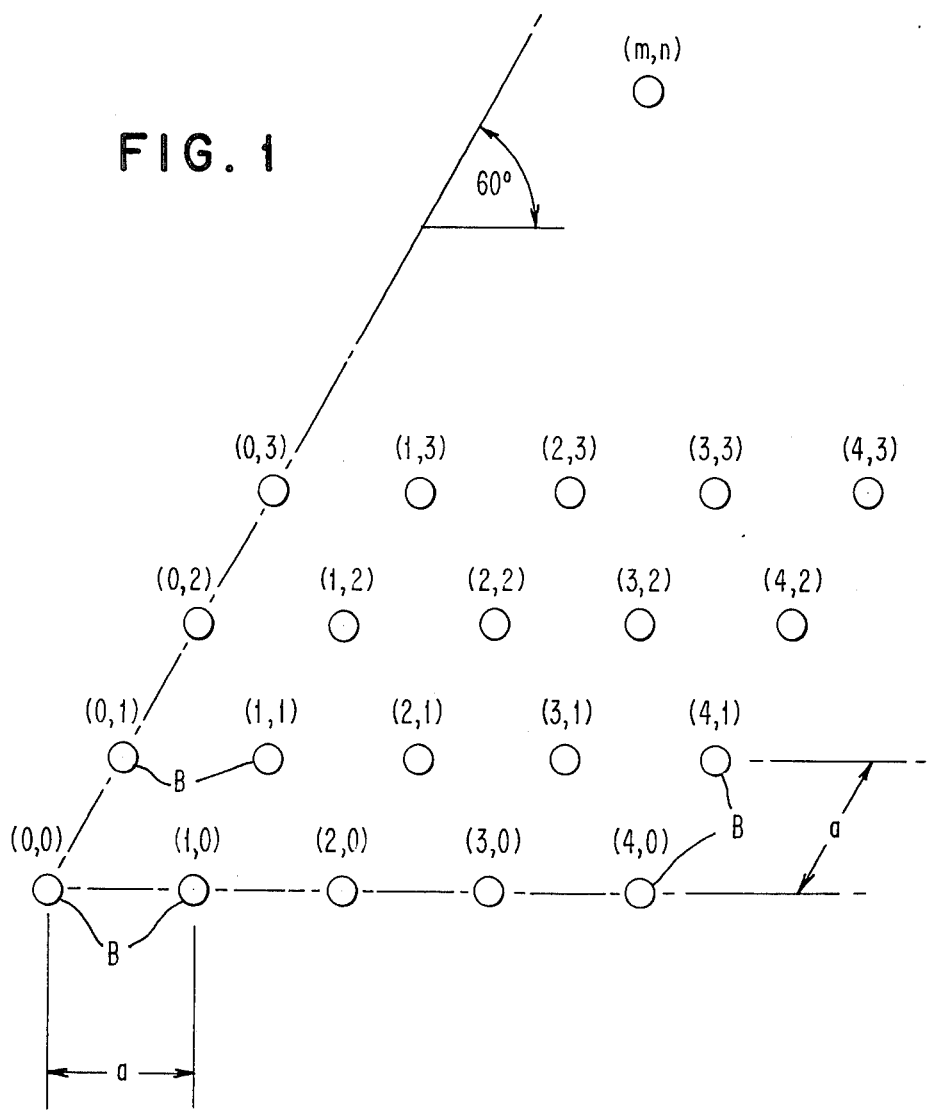

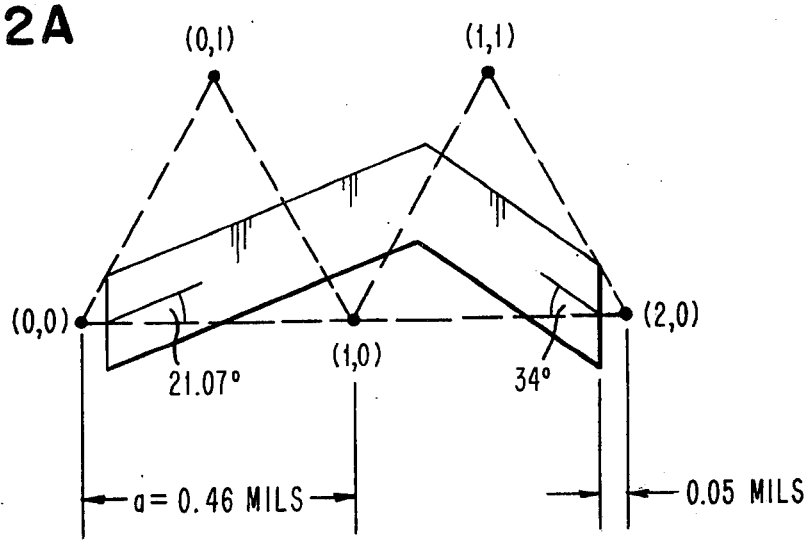
FIG. 2A — EXTREME SKEW
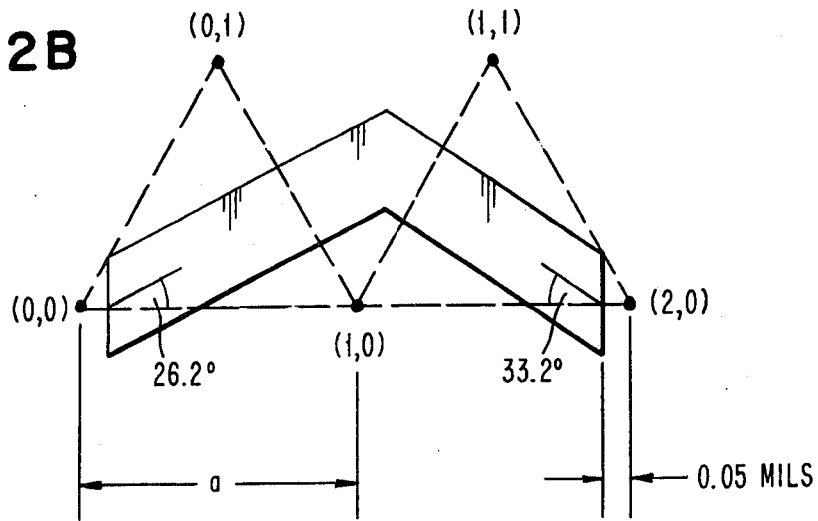
FIG. 2B — MODERATE SKEW

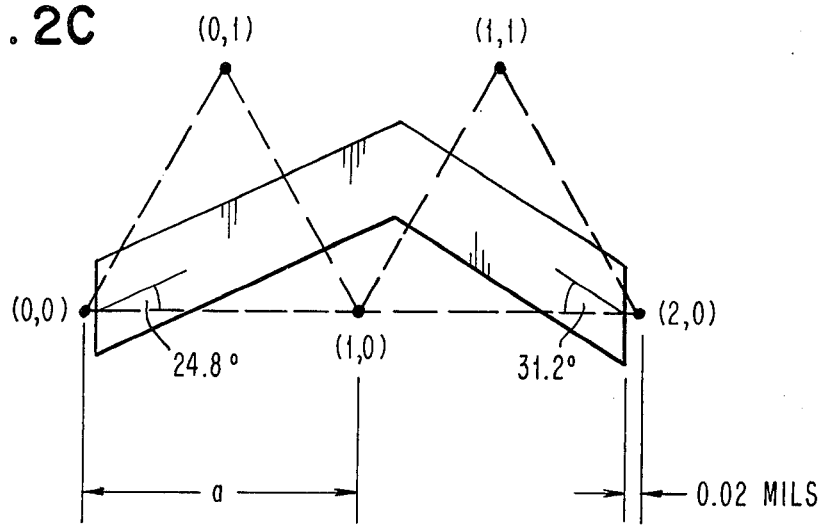
FIG. 2C — MODERATE SKEW (LONGER)
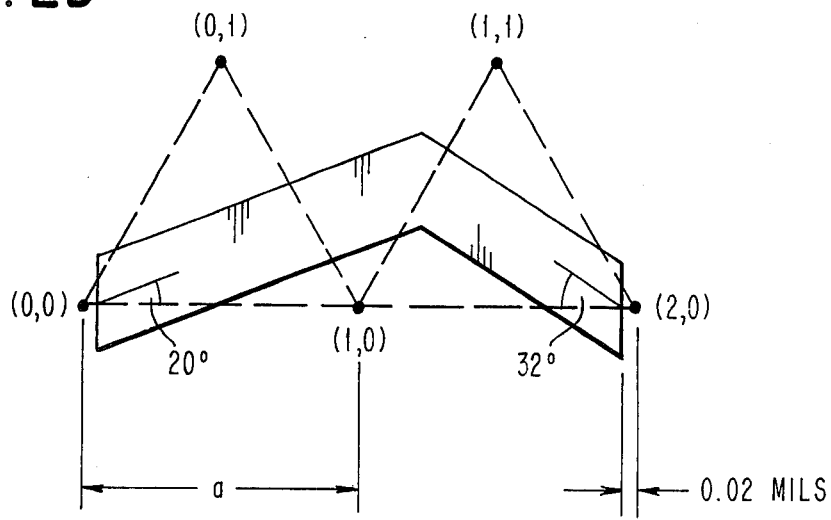
FIG. 2D — EXTREME SKEW (LONGER)

4,067,002

FIELD ACCESS OF BUBBLE DOMAIN LATTICE

CROSS REFERENCE TO RELATED APPLICATIONS

Copending application Ser. No. 604,978, filed Aug. 15, 1975, desribes a field access technique for moving a bubble lattice which uses crossed permalloy elements for moving the lattice in response to the reorientation of a magnetic field in the plane of the lattice.

BACKGROUND OF THE INVENTION

1. Field of the Invention

This invention relates to field access techniques for propagating magnetic bubble domains in a closely packed lattice in which the bubble domains interact with one another, and more particularly to the use of arrays of chevron shaped magnetic elements for propagation of bubble domains in a lattice.

2. Description of the Prior Art

Information systems using lattices of magnetic bubble domains are shown in copending U.S. patent applications Ser. No. 395,336, filed Sept. 7, 1973 now abandoned and Ser. No. 429,601, filed January 2, 1974. Additionally, B. A. Calhourn et al described the use of bubble lattices for information storage (Paper 7D-1) at the 20th Annual Conference on Magnetism and Magnetic Materials, held December 3-6, 1974, at San Francisco, California. At this conference, papers 7D-2 by L. L. Rosier et al, 7D-3 by J. S. Eggenberger, and 7D-4 by Ta-Lin Hsu also described different aspects of devices using magnetic bubble domain lattices. All of these papers were later published in the AIP Conference Proceedings No. 24 - Magnetism and Magnetic Materials-1974, pp. 617–626.

In these prior art bubble lattice devices, propagation of the lattice is generally achieved using conductor propagation. In these techniques, magnetic field gradients produced by currents in conductors move the lattice in order to access a portion of the lattice.

An alternative to the use of conductors for moving bubble lattices is described in aforementioned Ser. No. 429,601 and aforementioned paper 7D-2 (as well as in U.S. 3,930,244). In these references, translation of the lattice is achieved using buffer regions located at opposing ends of the lattice. The buffer regions contain parallel stripe domains which can be changed in size or number in order to shift the lattice back and forth. However, conductor patterns are still used to change the stripe domain patterns in the buffer zones.

Field accessing of magnetic bubble lattices is described in aforementiond Ser. No. 604,978. However, the patterns described there do not as closely conform to the lattice as the chevron patterns of the present invention and cannot be used to move the lattice along either its 0° axes or its 60° axes, which is possible using the asymmetric chevron patterns of the present invention. Further, the chevron arrays of the present invention enable multiple numbers of bubble domain rows and columns to be associated with each row and column of chevron elements. This means that less magnetic chevron elements are required while still providing reliable lattice translation.

Accordingly, it is a primary object of the present invention to provide an improved technique for translation of a magnetic bubble domain lattice using field access.

It is another object of the present invention to provide a technique for moving interacting magnetic bubble domains in a lattice using chevron shaped magnetic elements.

It is still another object of the present invention to provide a technique for translating multiple rows of bubble domains in a lattice by a single row of magnetic elements.

It is another object of the present invention to provide a technique for moving multiple columns of bubble domains in a bubble domain lattice by a single column of magnetic elements.

BRIEF SUMMARY OF THE INVENTION

Arrays of chevron shaped magnetic elements are used to move interacting magnetic bubble domains in a lattice of such domains. The array of magnetic drive elements is periodic and conforms to the bubble lattice framework. The array can be comprised of symmetric or skew shaped chevron elements and has great tolerance for change in the spacing between chevron elements, the spacing between rows of chevron elements or columns of chevron elements, the thickness of the chevron elements, and the length, width, or angle of the chevron elements.

The magnetic poles produces by the chevron elements when an in-plane magnetic field is present are close to the bubble lattice points and the attractive poles so produced are attractive in the direction of intended bubble motion. The repulsive magnetic poles produced by the chevron elements either repulse the lattice domains in the direction of intended motion or are neutral with respect to movement of the domains. During each reorientation of the in-plane magnetic field, the attractive poles are evenly distributed across the bubble domain lattice. Also, the driving forces on the bubble domains are approximately equal in magnitude at any given time.

A plurality of bubble domains can be associated with each of the chevron elements and, in a general case, the bubble domains take turns being actively (directly) driven by the chevron magnetic poles and indirectly driven by repulsive forces in the lattice. In the special case of an array comprised of extremely skewed and densely packed chevron elements, the actively driven bubbles remain so during lattice propagation while the indirectly driven bubbles remain passive during propagation.

These and other features, objects, and advantages will be more apparent from the following more particular description of the preferred embodiments.

BRIEF DESCRIPTION OF THE DRAWINGS

FIG. 1 is a coordinate plot of bubble domains in a lattice, giving the coordinate notation for the bubble domains.

FIGS. 2A-2D show various geometries for chevron magnetic elements used to move the bubble domains in the lattice of FIG. 1.

DETAILED DESCRIPTION OF THE PREFERRED EMBODIMENTS

FIG. 1

Figure 3A:
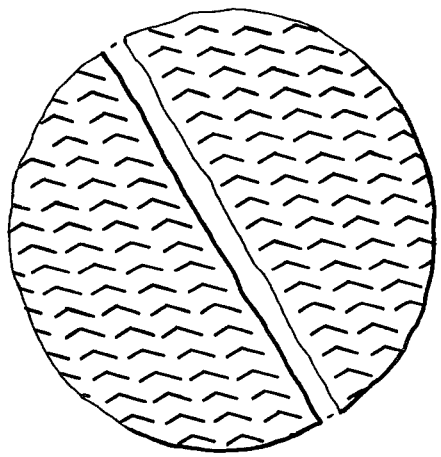
FIGS. 3A-3D illustrate arrays of chevron magnetic elements for movement of the lattice, where FIG. 3A corresponds to an array of the elements shown in FIG. 2A.
Figure 3B:
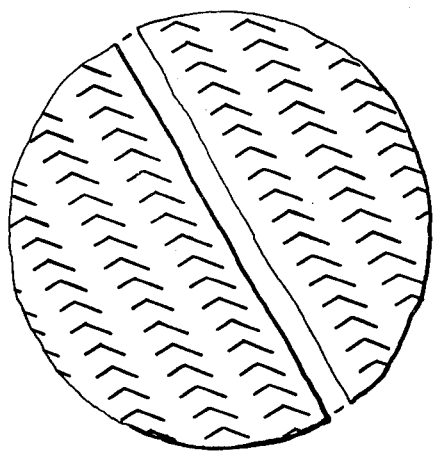
Figure 3C:
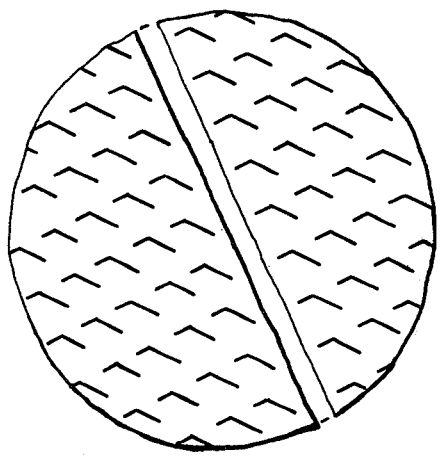

FIG. 1 shows a lattice of bubble domains B where the lattice coordinate position of each domain is designated by the column and row coordinates (m,n). Thus the bubble domain B at the lower left-hand corner of the lattice is in the zero column and zero row and has the coordinates (0,0). The lattice exhibits hexagonal close packing with the lattice columns being at a 60° angle with respect to horizontal lattice rows.

Lattices of bubble domains have been generated in magnetic bubble domain materials using several techniques. In the present situation, it was desirable to have a technique for generation of a lattice in the presence of the array of magnetic element chevrons which would later be used to drive the lattice. As known in the literature, pulsed normal fields are generally applied to a bubble domain material to generate a bubble lattice therein. For instance, J. M. Nemchik, Journal of Applied Physics, Vol. 40, pp. 1086-1087, Mar. 1, 1969 describes the generation of a lattice via uniform pulsed fields having pulse widths 30-200 nsec. and amplitude approximately equal to d.c. saturation magnetization of the film, to agitate and cut stripe domains at zero bias. This same type of technique was used to initialize the lattice in the garnet magnetic film sample used to successfully test the concept of the present invention. This garnet was $Eu_{0.65}Y_{2.35}Fe_{3.8}Ga_{1.2}O_{12}$ grown by liquid phase epitaxy on a 20 mil thick $Gd_3Ga_5O_{12}$ substrate. This bubble domain film had a thickness of 3.58 microns, material characteristic length l of 0.616 microns, and saturation magnetization $4\pi M_s$ of 180G. The bubble film produced a lattice having spacing (a) of approximately 11.75 microns with bubble diameter $d$ approximately 6.93 microns at a normalized bias field $h = H/4\pi M_s$ of 0.12.

LATTICE INITIALIZATION

For the garnet film described above, the following technique was used to generate a bubble domain lattice. A flat helical coil, consisting of 20 turns of #40 copper wire, with inner diameter ∼ 0.25 inch and outer diameter ∼ 0.375 inch, glued to 12.5 mil thick cover glass, was wound, and then attached to a boron nitride sample holder (used for its high thermal conductivity to assist in removing heat generated in the samples). When pressed against the back of the garnet substrate, to be situated parallel to the liquid phase epitaxy (LPE) bubble domain film, the coil produced a normal field of ∼ 30 Oe/amp at the central area of the sample film "enclosed" by the coil. For a pulse of 10 V amplitude, 3 μsec duration, and 1 KHz repetition rate, the coil had a measured risetime of ∼ 110 nsec and fall time of ∼ 120 nsec.

Lattice generation was achieved by applying to the film pulled normal fields via pulsed currents in the coil pressed against the back of the garnet sample, the pulsed currents were of 3μsec duration and 1 KHz repetition rate, producing pulsed fields of direction opposite to the magnetization of the desired lattice bubbles. The current amplitude was first increased (up to ∼ 2 amps) until the film's stripe domains were thoroughly agitated and then was slowly reduced, with the lattice growing as the fields became too weak to continue agitating the domains. It was observed that the lattice could be generated in this manner under a range of static bias fields $H_z$ normal to the film plane. The maximum pulse amplitude needed decreased as the bias was increased; narrower stripe domains required lower pulsed fields to agitate them. If a 1 MHz a.c. bias modulating field of amplitude $\Delta H$ was then applied, and the static bias changed to a desired value $H_z$, the lattice was observed to adjust its spacing and bubble size, apparently to the dimensions appropriate to the bias field $H_z + \Delta H$. Apparently, since the film was not precisely identical to the idealized film for which the chevron patterns were designed, the closest achievable lattice spacing was ∼ 12.5 μm, which was a small deviation from the design value of 11.75 μm.

Generation in the presence of permalloy chevrons was successfully achieved using a separation between the chevron pattern and the bubble film estimated at ∼ 4 μm. The coil was pressed against the back of the garnet wafer, and lattice generation was achieved using pulsed normal fields.

OVERLAY PATTERN DESIGN

Philosophy:

Propagation variations are designed using the following guidelines. To begin with, the nature of the bubble lattice involves repulsive bubbles very closely and densely packed. As such, the lattice exhibits very strong interaction forces that are kept in precise balance, with minute distortions of the lattice generating relatively large restoring forces. These are the forces that the present pattern designs exploit to facilitate controlled directional motion of the lattice. Therefore, all such minute lattice distortions should, if possible, be manipulated to direct the resulting restoring forces in the one direction of desired bubble lattice motion; i.e., all such distortions should be in the same relative direction from the original lattice positions. Conversely, distortions produced in random or conflicting direction create only conflicting internal lattice forces; any overall lattice motion would then be the result of the externally applied forces alone, perhaps obstructed rather than facilitated by the internal lattice forces. Such destructive lattice distortions are to be avoided.

For clarity, references to the bubble lattice will be appended with "lattice", while references to the magnetic element array will be modified with "array". Inn order to channel internal lattice interaction forces in a desired propagation direction, the periodic overlay patterns are designed to conform to the bubble lattice. That is, the drive elements should be arranged in an array, the periodicity of which is an integral multiple of that of the bubble lattice. And, where array columns and rows may be defined, these column and row directions should conform to two of the three principal axes (e.g., the 60° and 0° axes) of the hexagonal close-packed bubble lattice.

More precisely, the permalloy drive array should be designed in the following manner: the array points, each bearing an identical single drive element, should each be defined to be coincident with and directly associated with a single corresponding (stationary) lattice point, these particular lattice points being periodically located among the points of a complete fixed bubble lattice framework. (The remaining lattice points may be allotted to, and considered as indirectly associated with, these periodically placed array points.) In this manner, the periodicity of the permalloy array will be an integral multiple of that of the bubble lattice. Also, if these periodically placed array points are so organized that rows and columns can be defined, then these row and column directions will conform to two of the three principal axes of the bubble lattice. In this manner, the permalloy pole patterns induced in the array elements by a rotating in-plane field will be identically situated relative to their asociated lattice points to produce the uniformly asymmetric potential patterns, seen by the bubbles, that are needed to create the identically directed constructive lattice distortions that facilitate directional bubble lattice motion. At the same time, the random, destructive distortions that would most probably lead to random individual bubble oscillations are avoided.

The key, then, is the placing of array points to be coincident with lattice points periodically selected from among all of the lattice points. Every array point must be coincident with a point in a rigid, stationary bubble lattice framework. (However, since the intention is to employ bubble-bubble interactions to help drive several bubbles per magnetic element, the converse of the above should not be true, i.e., every lattice point should not be coincident with an array point.).

The designs set forth herein achieve certain goals which are important for good bubble lattice propagation. These are:
1. Bubbles in the lattice should be closely packed to provide high density devices, while the magnetic drive elements in the array should preferably be sparsely packed to provide ease of lithography.
2. Some bubbles in the lattice should be directly driven by magnetic poles established in the array, while the other bubbles in the lattice should be indirectly driven (as by bubble-bubble interactions).
3. There should be an approximately even spatial distribution of attractive magnetic poles established in the array during lattice motion.
4. Timewise, there should be an approximately equal drive on bubbles in the lattice. That is, the magnitude of the driving force on the bubbles in the lattice should be approximately the same at any time (i.e., at any orientation of the in-plane drive field).

As for the selection of the particular coincident points, the placement of the array points is intimately related to the shape and dimensions of the particular element pattern to be used. The pattrn shape and array should conform to the bubble lattice in the following manner:
1. The permalloy patterns are placed in the bubble lattice framework such that the magnetic poles produced by the permalloy elements are close to the lattice points,
2. This placement of magnetic elements is such that when the poles are attractive to the bubble domains, they will be attractive in the direction of intended bubble lattice motion, and
3. When the poles are repulsive to the bubble domains, they will either repulse the domains in the direction of intended motion or be neutral with respect to the domains.

Such placement of the poles will produce effective direct drive via the attractive poles, while minimizing the danger of bubble collapse or destructive lattice distortion due to the repulsive poles. In addition, the repulsive poles could also be put to constructive use by making the placement between lattice points slightly asymmetric, with the repulsive pole being closer to and therefore providing greater repulsive force on the lattice point farther "ahead" in the desired lattice motion direction. Thus, for example, a suitable design would be to make the length of each element roughly equal to an odd multiple of one-half of the lattice spacing. Height and angle for the element pattern are similarly influenced. Then, with desired gap size chosen such that the pole patterns conform as above, the array point arrangement follows. Of course, other designs which follow the general rules above can also be provided by those of skill in the art.

PATTERN DESIGN

The basic drive element pattern achieves a drive element array each point of which supports an identical element. In particular, the chevron drive element is a simple single pattern drive element having great affinity to possible regular, periodic array organization, particularly if that array organization requires conformation to skewed axes such as the 0° and 60° axes of a hexagonal bubble lattice, rather than to orthogonal 0° and 90° axes.

Possible design parameters are numerous for any choice of basic drive element and include element bar width, spacer thickness between the drive array and the bubble material, thickness of the magnetic drive elements, chevron length, height, angle, and the gap size. In the tests conducted, certain parameters were intentionally restricted to reduce the number of variables used for testing the design concept. The parameters which were fixed were:
1. The chevron bar width which was fixed at roughly one-half of the mean bubble diameter, the value found to be optimal in conventional bubble devices.
2. The spacer thickness between the drive overlay and the bubble material which is usually dictated by lattice generation capabilities and which when determined, is held contant.
3. The thickness of the magnetic drive elements.

It should be emphasized that these restrictions are not intrinsic for the operability of these devices but have been imposed to facilitate laboratory testing.

As will be more fully apparent, the great variety of geometries and array arrangements which can be used allow one to change (1) the number of bubbles that may be driven, directly and indirectly, per drive element, and the dependence on pole strength; (2) the separation that can be tolerated between drive elements (gap size, distance between element rows and columns) — wide spacing between drive elements allows less stringent lithography requirements; (3) the trade-off between such spacing and the reliability of bubble motion modes. Essentially, all of these interdependent issues can be reduced to that concerning the effects of pole strength and pole density.

Although it is possible to design many more drive elements using the principles of this invention, four chevron patterns will be described. These various designs were used to determine the effects of various parameters. For instance, designs of chevrons having moderate and extreme skewed angles (shown in FIGS. 2B and 2A, respectively) were used to examine the effect of skewness in promoting unidirectional motion for a clockwise sense of rotation of the in-plane drive field, with respect to the pattern orientation. Skewness also permits greater packing density of the drive element array and provides a test of the effect on the bubble lattice of a drive array having high pole density.

Still further, symmetric chevron drive elements of roughly 90° angle and greater height can be compared with flatter symmetric chevrons of roughly 120° angle and lesser height for bi-directional motion, and more lattice rows per chevron row (lower pole density, and more bubbles per drive element) than in skew designs. Slightly longer versions of each of these patterns were used to test to what extent the gap size required precise critical values (FIGS. 2C, 2D, respectively).

Each pattern tested was arranged in an array of small gap size, the value being roughly one-third of the mean bubble diameter. Then, the skewed pattern and small symmetric patterns, including both shorter and longer versions, were arranged in arrays of successively larger gaps or greater spacing between chevron rows. In each successive step, the gap was increased by approximately one bubble lattice spacing. These variations produced successful drive arrays which allowed examination of the gap size, the number of bubbles that could be driven by a given element pattern, and the trade-off between these two considerations in terms of reliability of motion. Finally, the skewed and smaller symmetric patterns were also arranged in "staggered" arrays in which, though still periodic, the drive elements could no longer be readily defined in 0° and 60° rows and columns. Arrangement in such arrays allowed examination of the effect of a slightly different pole arrangement that still conformed to the bubble lattice in the manner set forth above, but not as precisely aligned rows and columns.

Device design was done in terms of the bubble lattice spacing and the mean bubble diameter. Once these two values are determined depending upon the materials used, the design dimensions can be readily adopted. As will be appreciated by those of skill in the art, the drive element pattern and array designs are not restricted to a specific bubble domain film or to specific bubble material properties. Instead, these patterns and array designs are easily adaptable to any specifc film or nominal free bubble diameter.

In the device patterns to be more fully described, the garnet bubble domain film was the same as that described previously, and the chevron patterns had bar widths approximately 3.5 microns while the smallest gap size between adjacent chevrons in the same row was approximately 2.54 microns. The lattice spacing is about 11.7 microns.

SPECIFIC PATTERN DESIGNS
(FIGS. 2A-2D and 3A-3D)

FIGS. 2A-2D show various drive patterns, while FIGS. 3A-3D show representative arrays of various drive patterns. For instance, the asymmetric chevron drive pattern of FIG. 2A is shown in an array illustrated by FIG. 3A. FIGS. 2A-2D also show the orientation of the chevron drive patterns with respect to the coordinates of the bubble lattice. Dimensions are given with respect to the lattice constant (a), the angles of the chevron bars, and the distances between the ends of the chevron bars and the adjacent lattice points.

FIG. 2A shows a skewed chevron drive element, while FIG. 3A shows an array of these drive elements having a conventional size gap of 2.54 microns between adjacent chevrons in a row. Again, the arrangement of the chevron element with respect to the lattice coordinates is shown.

Asymmetric chevron patterns such as that of FIG. 2A are designed to provide the greatest permalloy pole density which can be fitted into a close packed bubble lattice. The skew and height of the chevron pattern are chosen to allow maximum chevron packing density in 60° chevron columns and also to place the chevron peak, when supporting a repulsive pole, between the lattice rows.

Figure 3D:
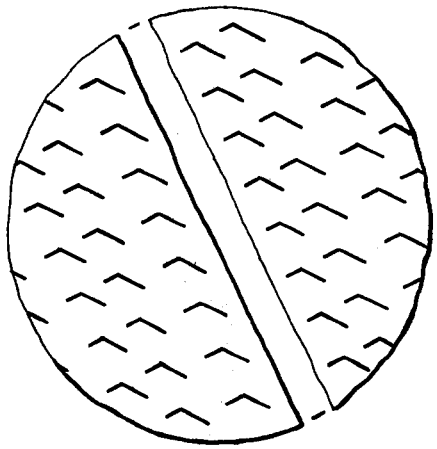
Figure 4:
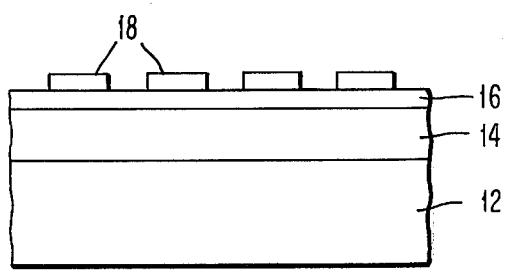
FIG. 4 is a cross-sectional illustration of the bubble domain material and the chevron propagation pattern used to move a lattice of domains in the bubble material.

The array of FIG. 3D aligns one lattice row and two lattice columns with each chevron row and each chevron column, respectively, Each chevron element may be considered to be associated with two bubble domains.

Figure 5A:
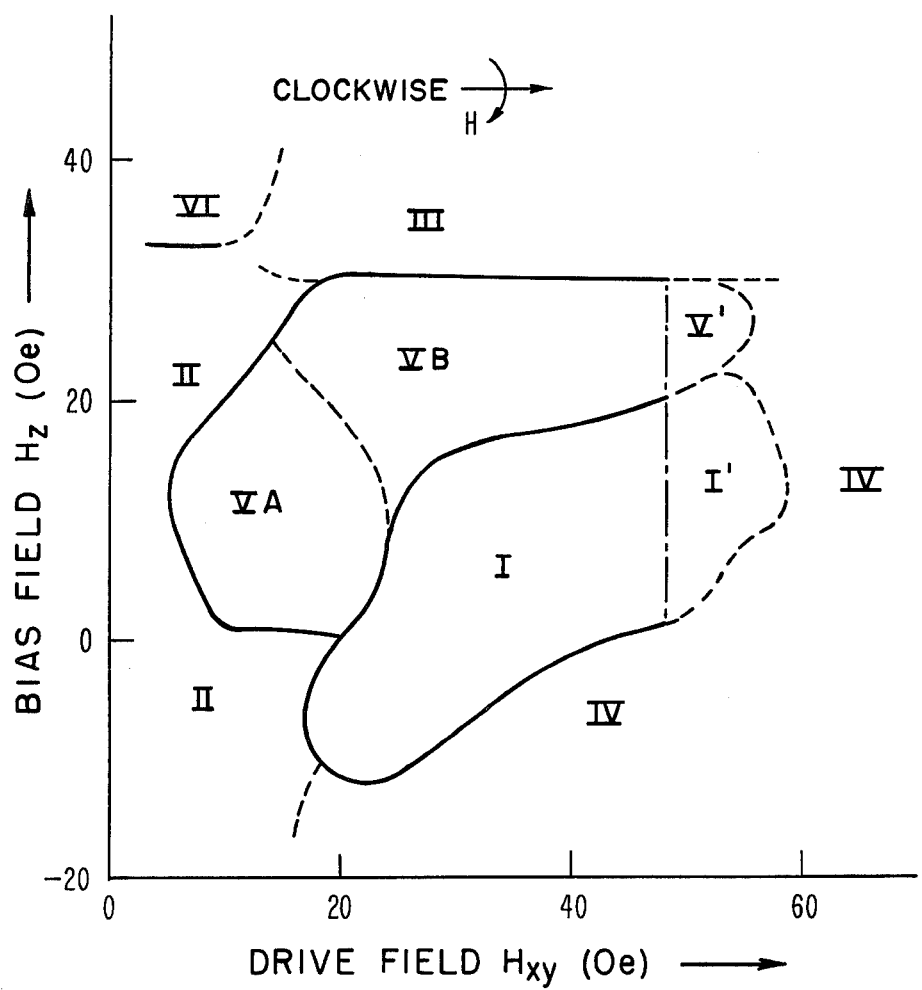
FIG. 5A is a margin pot for movement of a bubble domain lattice by the array of chevron elements shown in FIG. 3A, where the drive magnetic field rotates in a clockwise direction.
Figure 5B:
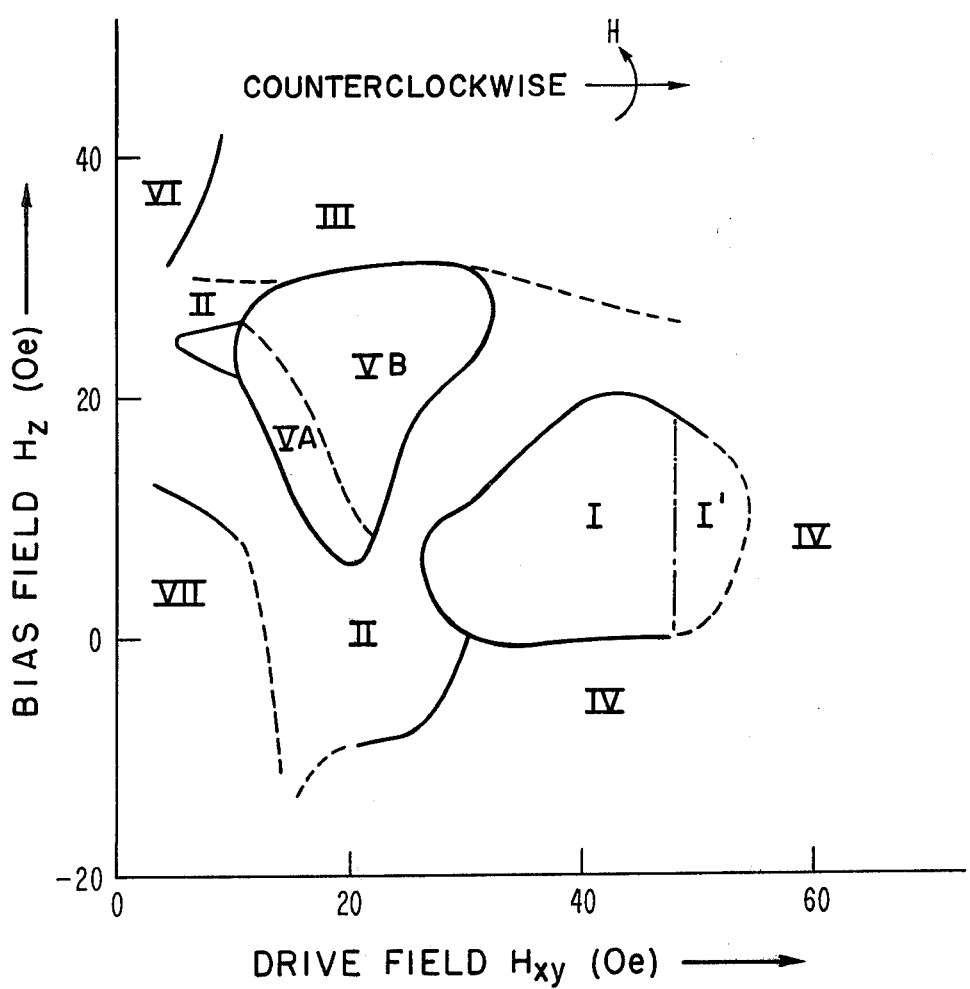
FIG. 5B is a margin plot for movement of bubble domains in a lattice using the chevron array of FIG. 3A, where the drive magnetic field rotates in a counter-clockwise direction.

The asymmetry of a skewed chevron pattern means that bubble motion to the right and to the left in response to different senses of the rotation of the magnetic drive field is not equally successful or reliable. This will be more apparent when the margin plots of FIGS. 5A and 5B are discussed.

With each rotation of the magnetic drive field, the pattern of FIG. 3A advances the bubble lattice by one bubble column or half a chevron column in the 0° direction. Comparisons of propagation behavior and failure modes for the different chevron patterns will be presented later.

OTHER PATTERN DESIGNS (FIGS. 2B-2D and 3B-3D)

FIGS. 2B-2D show variations of the skewed chevron pattern previously described with respect to FIG. 2A.

The skewed chevron element shown in FIG. 2B is a moderately skewed element as compared to the extreme skewed element of FIG. 2A. The chevron element shown in FIG. 2C is similar to that in FIG. 2B, but is longer. The skewed pattern shown in FIG. 2C is similar to that in FIG. 2A except that it is longer than the one shown in FIG. 2A. However, it is pattern exhibiting extreme skew, the same as that of FIG. 2A.

Arrangements of the patterns of FIGS. 2B-2D into arrays have been made and successfully tested for bubble lattice propagation. However, these will not be described in great detail, since the principles of the invention will be fully apparent when the chevron array of FIGS. 2A, 3A is discussed.

FIG. 4

This figure shows a cross-sectional view of the bubble domain propagation circuit including the substrate 12 onto which the magnetic bubble domain material 14 is deposited. Layer 16 is a spacer layer, typically comprising $SiO_2$. Layer 18 is a soft magnetic layer which has been patterned to provide the chevron elements used to move a bubble domain lattice in magnetic medium 14. Typically, layer 18 is comprised of a magnetically soft material such as permalloy.

During testing, the permalloy was deposited on a glass substrate and then brought into close proximity with the underlying bubble domain film. This allowed many variations of the drive patterns to be tested. Because the separation between the drive elements and the underlying bubble film was greater in this case (about 3 microns), the thickness of the chevron drive elements was approximately 5500 Angstroms. However, more conventional spacing thicknesses (1 micron) and permalloy layer thicknesses (3000 Angstroms) can be used when propagating typical 5 micron bubles. As the bubble size decreases, the normal adjustments in permalloy thickness, permalloy-to-bubble material spacing, etc. are made as is well known in the art.

The spacer layer 16 and overlying permalloy layer 18 are provided in accordance with well known techniques. For instance, the insulation layer 16 can be sputtered while the permalloy layer 18 can be electroplated onto a plating base, which is later removed by ion milling or another etch technique.

MARGIN PLOTS
(FIGS. 5A, 5B)

These margin plots show bubble lattice propagation for the drive array of FIG. 3A. More specifically, they are plots of the bias field $H_z$ versus the in-plane reorienting drive field $H_{xy}$ for the array of FIG. 3A. These margin plots have been developed through laboratory testing and they indicate the various tolerances of propagation. Since the exact permalloy layer-bubble material separation was not precisely known, being approximately 3-5 microns, the field strengths used in the observation of lattice motion are not significant as absolute numbers. Rather, the sizes of the ranges of field values provide an indication of the lattice propagation using these arrays. All of the tested drive array supported the regular column translation mode (i.e., the bubble lattice was moved column-by-column along the 0° axes common to lattice rows and permalloy array rows (for some combination of normal bias field and in-plane drive field $H_{xy}$, with the constant condition of a 2.5 Oe peak amplitude, 1 MHz a.c. bias modulation field to overcome coercivity effects in the lattice).

In particular, the tested arrays of symmetric chevrons all appear to share very similar, reliable translation modes. Also, the small gap, exterme skew pattern shown in FIG. 3A appears to support many different modes in addition to a reliable translation mode.

FIGS. 5A and 5B show margin plots for movement of bubble lattices by the array of FIG. 3A, where FIG. 5A illustrates the margins for clockwise rotation of the drive field $H_{xy}$, while FIG. 5B illustrates the margins for counterclockwise rotation of the drive field. As was noted previously, the asymmetry of the basic chevron pattern indicates that motion to the right will not be the same as motion to the left.

As will be remembered, the asymmetric patterns provide the highest permalloy pole density which can be fitted into a close packed bubble domain lattice. This pattern (FIG. 3A) aligns one lattice row and two lattice columns with each chevron row and each chevron column, respectively. Therefore, each chevron is associated with two bubbles. This pattern has a skew and height such that maximum chevron packing density in 60° chevron columns is obtained. Also, the chevron peak, when supporting a repulsive magnetic pole, is located between adjacent lattice rows. With each field rotation, the bubble lattice advances by one bubble column or half a chevron column in the 0° direction. At higher bias and/or lower drive field, the bubble lattice advances by one bubble row or one chevron row in the 60° direction.

The high density asymmetric chevron patterns have much in common with the low density symmetric chevron patterns in terms of the induced propagation behavior and failure modes. However, there are also significant differences due to the high pole density and asymmetry in the chevron pattern of FIG. 3A. The high density of permalloy poles makes the bubble lattice motion less dependent on bubble-bubble interactions and more dependent on pole strength. The extremely skewed chevron of FIG. 3A results in great discrepancy in the strength of the poles at the end of the long right-hand bar, the short left-hand bar, and the apex of each chevron. Moreover, the close proximity of chevron rows makes bubble domains vulnerable to permalloy poles of the adjacent rows of chevrons. As a net result, asymmetric chevron devices are more sensitively dependent on the basis field amplitude and the magnitude and sense of rotation of the drive field, and exhibit a greater variety of lattice motions.

In FIG. 5A, a margin plot for clockwise rotation of the field $H_{xy}$ is shown for the array of FIG. 3A. This margin plot shows various regions of motion defined as the following:

I. Bubble Lattice Translation (0° direction column propagation). Apparent defect translation within the bubble lattice.

I'. Bubble Lattice Translation With Defect Encroachment.

II. Mixed Bubble Lattice Motions (0° column, 60° row translation and other modes of motion.

III. Diluted Bubble Array Oscillation (erratic motion of disordered transformed bubble lattice).

IV. Passive Bubble Displacement and Collapse (also bubble lattice translation in 30° direction).

V. Including regions VA and VB — Bubble Lattice Translation (60° direction row propagation). Apparent defect oscillation within the bubble lattice.

V'. Bubble Lattice Translation With Defect Encroachment.

VI. Transformed Lattice 60° Direction Translation.

VII. (FIG. 5B): Bubble Lattice Oscillation.

Referring to FIG. 5A, the main regions of interest are region I directed to 0° direction column propagation and region V directed to 60° direction row propagation. At high drive field $H_{xy}$ and/or low bias field, the actively driven bubble is expanded, while a passive bubble associated with the same chevron is shrunken both by the repulsive permalloy pole and the expanded active bubble. The active bubble remains active throughout the field cycle and stays on the permalloy row of the chevron, resulting in 0° direction column translation. In region I, the lattice consists of alternate columns of active and passive bubbles. The overall motion of the lattice combines a significant vertical oscillatory motion with regular 0° direction column translation, as will be seen in more detail in FIGS. 6A–6E.

By contrast, at low drive fields and/or high bias fields, when the bubbles are stiffer and the active and passive bubbles are almost equal in size, the asymmetry and high pole density of the skewed chevron element cause translation of lattice rows along a 60° direction. The critical time phase of the rotating field is when the apex becomes an attractive pole. At this time, the previously passive bubble located right underneath the apex slides up and becomes the new active bubble. The previously active bubble, being at the far end of the long left-hand bar of the chevron, loses the race to the new pole and becomes a passive bubble, thereafter seeking a neutral position between two repulsive permalloy poles. In the next time phase of the drive field, the new attractive pole at the end of the short right-hand bar will attract the previously passive bubble and make it active. The previously active bubble is pushed into a neutral position by a new active bubble from the lattice row below, and becomes passive. The overall motion of the lattice combines a significant horizontal oscillatory motion with the regular 60° row translation.

Simple defects covering two adjacent lattice points have been created during the imperfect lattice generation process used to develop these margin plots. Therefore, in field region I, it has been observed that old defects contract to disappear due to repulsive poles while new defects appearing by growth of bubbles attached to attractive poles move into the voids left by old defects. Due to the high permalloy pole density, the defects appear to oscillate but stay at the same lattice points while the bubble lattice advances.

In region VA, isolated innate defects are found to be carried along stably in the overall lattice motion. However, in region VB, the defects usually are subject to a regular, periodic contraction of old defects and elongation of new ones. Again, they appear to oscillate but stay at the same lattice points while the bubble lattice advances. In both regions, I and V, strong poles tend to retain defects at their original positions.

Surrounding essential propagation regions are various failure regions. In the low bias and low drive field region II, a mixture of bubble motions (in distinction from innate defects) has been observed, which varies unpredictably in space and in time sequence. These motions include (1) 0° direction column translation, (2) 60° direction row translation, (3) bubble lattice oscillation, (4) row-column translation, and (5) another 0° direction column translation. This region arises not due to innate defects, but due to the ambiguity of equally flavorable modes of lattice motion.

At high bias fields in region III, the bubble lattice is diluted following the retreat of surrounding stripe-defect areas. With the high pole densities, particularly at higher drive fields, the remaining bubbles tend to be in very erratic motion, finding a different accomodation to the changing pole patterns at each phase of the drive field.

At the high drive field region bordering I and V (V for clockwise only) rapid stripe defect growth from the periphery of the good lattice region into the center has been observed.

At even higher drive fields or lower bias fields, the active bubbles in alternate columns grow very large. The passive bubbles, also in alternate columns, being trapped in between active bubble columns, are subject to the collapsing fields of both the active bubbles and permalloy poles and are usually collapsed. Thus, in one field cycle, only the alternate active bubble columns survive. From then on, in one cycle, the expanded active domain will be shifted downward by one chevron row (one lattice row) and to the right by one chevron column (two lattice columns).

At very high bias fields and very low drive fields, the lattice assumes a diluted and reoriented configuration, which shifts downward along the chevron columns.

FIG. 5B shows the margin plot for counterclockwise rotation of the drive field $H_{xy}$. In general, the propagation direction for clockwise field rotation is opposite to that for counterclockwise field rotation (left instead of right, down instead of up, etc.). By and large, similar behavior regions have been observed for both clockwise and counterclockwise reorienting drive fields. The major difference between counterclockwise and clockwise field rotation is the great expansion of region II between region I (0° column propagation) and region V (60° row propagation), and the appearance of periodical lattice oscillation in the low bias, low drive region VII.

With the asymmetry in the chevron pattern, the long left bar yields a stronger pole than the short right bar. When the field rotation is changed from clockwise to counterclockwise, the sequence of pole strengths and the distances seen by racing bubbles to capture new poles have been altered. For example, consider an active bubble crossing a gap as the attractive pole shifts across it. For clockwise rotation of the drive field and bubble motion to the right, the long left-hand chevron bar on the right side of the gap first exerts a strong repulsive force to repel and shrink passive bubbles, and then exerts a strong attractive pole to attract and expand the active bubble across the gap. For counterclockwise drive fields and bubble motion to the left, the short right-hand chevron bar on the left side of the gap is less able to shrink a passive bubble and less able to pull an active bubble across the gap. Particularly at low drives (weak poles) and low biases (large bubbles) the asymmetry in the gap crossing ability of the active bubble becomes accentuated. The success in gap crossing accounts for the extension of reliable propagation regions I and V to considerably lower biases and drives for clockwise rotation than for counterclockwise rotation. The failure in gap crossing gives rise to the phenomenon of lattice oscillation and row column translation and motion in region II.

The emergence of an ambiguous region between regions I and V can be interpreted by the balance of pole strengths and bubble size and position in time sequence.

LATTICE PROPAGATION

This section describes bubble lattice propagation using the asymmetric chevron array of FIG. 3A. FIGS. 6A–6E illustrate column translation along the 0° direction in response to clockwise rotation of drive field $H_{xy}$. Operation in this manner is described by region I of FIG. 5A. Translation by an array of chevron elements having very little skew is quite similar to that using asymmetric elements and will be described later.

At high drive field and/or low bias field, the actively driven bubble A is expanded by the positive pole produced at the right-hand end of chevron 20 when field $H_{xy}$ is in phase 1. The passive bubble B is shrunken by the repulsive permalloy pole at the left-hand end of chevron 22 and also by the expanded active bubble A. Bubble A remains active throughout the field cycle and stays on the permalloy row, resulting in 0° direction column translation, as can be seen by referring to FIGS. 6A–6E. Therefore, the lattice consists of alternate columns of actively driven and passively driven bubbles. Thus, as field $H_{xy}$ rotates to phase 2, large bubble A expands across the gap between chevrons 20 and 22 while bubble B is pushed to the right along chevron 22.

When the drive field rotates to phase 3, an attractive pole is established at the left-hand end of chevron 22 and the active bubble A resides there. The repulsive pole at the right-hand end of chevron 22 prevents passive bubble B from moving further to the right. Also, bubble B remains small due to the action of the repulsive pole at the right-hand end of chevron 22 and due to the expanded bubble A.

As the field rotates to phase 4, the apex of chevron 22 becomes positive pulling bubble A to the apex. At the same time, bubble B is pushed to the right but is repulsed by the negative pole on the left-hand end of chevron 24. Therefore, it slides upwardly to be located between chevron 24 and chevron 26 slides in the next chevron row.

Figure 6A:
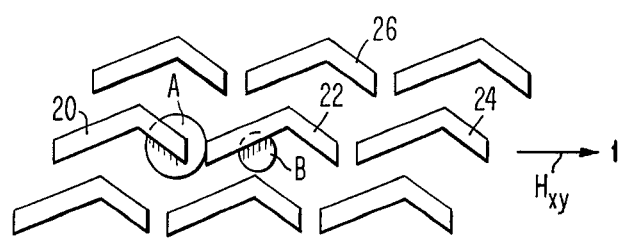
FIGS. 6A-6E illustrate movement of columns of bubble domains in a lattice by the chevron array of FIG. 3A, in response to the reorientations of an in-plane magnetic field.
Figure 6B:
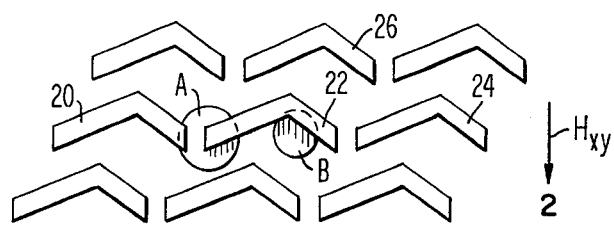
Figure 6C:
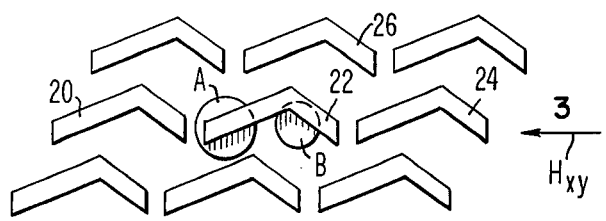
Figure 6D:
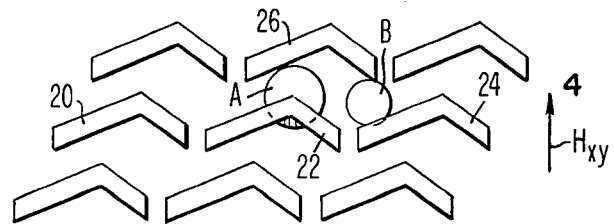
Figure 6E:
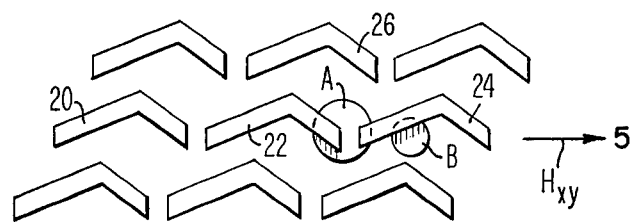

As the field $H_{xy}$ rotates to phase 5, bubble A is drawn to the positive pole on the right-hand end of chevron 22 while bubble B is pushed to the right as shown in FIG. 6E.

The overall 0° column motion of the lattice combines vertical oscillatory motion with regular 0° direction column motion.

ARRAYS OF SYMMETRIC CHEVRON ELEMENTS

Whereas FIGS. 2A–2D show different skewed (asymmetric) chevron elements, symmetric chevron patterns can also advantageously be used to drive magnetic bubble domains in a lattice. In fact, arrays of symmetric chevrons can be used to move multiple rows and multiple columns of bubble domains per chevron row or column.

The symmetric chevron elements have bar lengths equal to one another, and different patterns were provided by changing the length of the bars and the angle of the apex of these bars. Further, the spacing between adjacent symmetric chevrons was changed from a minimum of about one-half bubble diameter to a gap greater than two bubble diameters in test arrays. Successful propagation was achieved with all of the arrays of symmetric chevron elements.

With one particular array of symmetric chevron elements where the spacing between adjacent elements was about half a bubble diameter, two bubble lattice rows and two bubble lattice columns were aligned with each chevron row and each chevron column so that each chevron could be considered as being associated with four bubble domains. During each orientation of the in-plane magnetic field, one out of four of the bubble domains was actively driven by a magnetic pole, while the others were moved by bubble-bubble repulsion. Different bubble domains were directly driven during different times in a complete cycle of the drive field.

Using the identical chevron pattern, the spacing between adjacent chevron patterns was increased to more than two bubble diameters. There were then six bubble domains (in two rows and three columns) associated with each chevron drive element. Most of the time only one out of six bubbles was directly driven by magnetic poles associated with the chevrons. The bubble lattice advanced by one lattice period per field rotation, or by one chevron period per three field rotations. Therefore, successful lattice propagation was provided with an array in which the lithography requirements were more relaxed.

The length and width of the bars of the symmetric chevron drive elements can also be changed to provide different margins of bubble propagation and differing numbers of bubbles associated with each of the chevron elements. For example, the distance between adjacent chevrons can be changed while their bar lengths are increased to provide stronger poles. Successful bubble propagation will be provided by this modified array of symmetric elements. Still further, the angle between the chevron bar elements can be changed, one example being a 90° angle while a flatter symmetric element has approximately 120° between bar lengths.

While bidirectional motion along the 0° axes of the lattice can be provided by reversing the sense of the drive field using arrays of symmetric chevron elements, multi-dimentional lattice motion (i.e., along the 0° and 60° axes) cannot be provided using symmetric chevron elements. The main advantage of the symmetric elements is that arrays of these elements can be provided which will move multiple rows and columns of bubble domains per chevron row and column. This provides drive arrays that are easily fabricated without stringent lithography. For instance, bubble domains can be driven by symmetric chevron patterns which have a width two or more bubble diameters, where the spacings between adjacent chevron elements are not critical. When varying the width, bar length, and spacing between adjacent chevrons, the basic rules described previously are followed in order to insure the asymmetry of the drive produced. That is, the lattice is retained in order and shape and the asymmetric drive provides movement in the intended direction.

SUMMARY

Despite the basic differences of pole density, strength, and symmetry between the skewed chevron array and the small-gap and wide-gap symmetric chevron arrays, the reliable modes of lattice translation all result from the alternating of directly and indirectly driven status within a group of bubbles and rely heavily upon bubble-bubble repulsive interaction forces to move the passive bubbles. The high bias failure modes are virtually the same for all of the variations; i.e., the shrinking of bubble size weakens interactions and this combined with the shrinking of defect areas leads to lattice dilution, which in turn further weakens lattice interactions. The lattice and chevron array then no longer conform in the requisite manner, and controlled lattice translation is lost.

Similarly, the skew and wide gap variations exhibit high drive failure modes in which the directly driven bubble, because of the strength of its interaction with the permalloy, is able to retain its active status throughout the drive field cycle. The lattice interaction forces are no longer constructively directed and used; failure of controlled lattice translation results. In fact, this failure exhibits essentially isolated-bubble device operation, in which the single bubble follows faithfully the attractive pole through the entire device structure and field cycle. However, in the array of FIG. 3A, where extreme skew elements are used, successful propogation results when the actively driven bubble remains as such during the entire propagation. In all other arrays, the bubbles associated with each chevron take turns being the active and passive bubbles. Thus, one may speculate that, as the permalloy-bubble film separation is decreased, the actively driven bubbles will behave in a manner increasingly similar to that of bubbles in conventional devices. Though the minimum drive field may be reduced somewhat, the high-drive limit may be expected to be reduced much more significantly.

A periodic permalloy pattern array designed as stated herein can easily and efficiently provide controlled bubble lattice translation capability needed for rotating field driven lattice file. In contrast with previously used conductor-access schemes, the use of periodic permalloy patterns can restore all the advantages of field-access techniques to at least the lattice translation requirements of a lattice file. The magnetic array requires fewer chip connections and the number needed should not increase with array size. Very little on-chip power dissipation is produced and each permalloy element is fully capable of supporting numerous bubble domains. Whereas wide-gap chevron variations can translate six bubbles per chevron, translation of even larger numbers of bubbles per chevron is possible. Thus, more bubble columns may be driven per chevron column than that shown, and also more bubble rows may be supported by each chevron row than that shown herein. Thus, this invention offers the possibility of a few widely spaced magnetic elements driving a large bubble lattice area.

The wide-gap variations have demonstrated that gaps between adjacent chevrons in the array may be much larger than the gaps in conventional field access devices where the gaps are roughly one-third of the mean bubble diameter. Gaps even wider than those tested (about two bubble diameters) appear to be feasible as indicated by experimentation. Further, the precise size of these wider gaps is not critical, thereby allowing greater lithography and processing tolerances.

It appears that lattice translation using periodic magnetic patterns in this manner may also be relatively insensitive to lithography or process-induced defects in the permalloy pattern. Additionally, it appears that linewidth requirements may also be quite flexible. In particular, larger linewidth patterns could be used to propagate lattices of smaller bubbles. The propogation modes observed indicate that the very strong repulsive interactions within the bubble lattice are necessary for successful propagation. Of course, this bubble-bubble repulsion is purposely avoided in conventional devices. However, conventional devices are subject to bubble hang-up and strip-out on magnetic patterns with too large linewidth (the ideal being half the mean bubble diameter). With the added force of bubble-bubble repulsion in the bubble lattice, the lattice bubbles do not strip-out on large magnetic patterns and, with properly designed periodicity in the magnetic arrays, hang-ups should not be a problem in large linewidth patterns. Perhaps, even gapless structures making full use of the interactions within the lattice may provide reliable propagation. Relaxing linewidth requirements would provide easier lithography which makes possible lattices of much smaller bubbles and spacing, and therefore density, using conventional lithography techniques.

Thus, the present invention describes the use of magnetic arrays for movement of a lattice in which many parameters can be changed while still providing successful lattice propagation. As will be appreciated by the person of skill in the art based on the teachings herein, many variations of the basic geometry, thickness, magnetic element-garnet spacing, etc., can be utilized to provide successful lattice translation. Thus, the individual drive elements may be comprised of a magnetic layer or may be apertures in a continuous magnetic layer. Still further, ion implanted regions in the surface of the bubble material may be used to define the magnetic drive arrays. Also, the linewidth of the drive elements can be changed to, for instance, widths of about two bubble diameters in order to provide stronger poles to drive more than one layer of bubble lattice domains.

What is claimed is:

1. A structure for moving magnetic bubble domains located in a two-dimensional lattice of interacting bubble domains in response to the reorientation of a magnetic field, comprising:
    a magnetic medium in which said domains can be propagated,
    an array of periodically arranged magnetic elements which have chevron shape, along with magnetic poles are produced in response to the different orientations of said magnetic field, for movement of domains in said lattice, while maintaining the integrity of said lattice.

2. The structure of claim 1, wherein said chevron elements are located with respect to said lattice such that magnetic poles established by said reorienting magnetic field are close to lattice points.

3. The structure of claim 2, wherein said magnetic elements are located with respect to said lattice that attractive poles produced by said elements move said bubble domains in the direction of intended motion.

4. The structure of claim 2, where said magnetic elements are located with respect to said lattice such that when said poles are repulsive to said domains, they will repulse said domains in the direction of intended motion.

5. The structure of claim 1, where said magnetic elements are comprised of magnetically soft material.

6. The structure of claim 1, where said lattice is comprised of rows and columns of said bubble domains and said magnetic elements in said periodic array are arranged in rows and columns corresponding to selected rows and columns of said lattice.

7. The structure of claim 6, wherein said magnetic elements have a periodicity which is an integral multiple of the periodicity of said lattice.

8. The structure of claim 1, wherein said chevron elements are skewed.

9. An apparatus for translating a two-dimensional lattice of interacting bubble domains in response to the reorientation of a magnetic field, comprising:
    first means for moving selected bubble domains in said lattice by magnetic poles during a first orientation of said magnetic field,
    second means for moving said selected bubble domains in said lattice by repulsive forces due to bubble-bubble interactions during a second orientation of said magnetic field,
    said first and second means substantially retaining the order and shape of said two-dimensional lattice during said bubble domain movement, wherein said first and second means are comprised of chevron-shaped magnetic elements periodically arranged in an array.

10. The apparatus of claim 9, where the periodicity of said elements in said array is an integral multiple of the periodicity of said bubble domain lattice.

11. The apparatus of claim 9, where said magnetic elements are arranged in a staggered array such that magnetic poles produced along said magnetic elements are periodically located with respect to said lattice.

12. An apparatus for moving magnetic bubble domains located in a magnetic medium and having a two-dimensional lattice arrangement wherein adjacent bubble domains interact with one another in said lattice, in response to the reorientation of a magnetic field, comprising:
    means for moving a two-dimensional group of bubble domains in said lattice in a desired direction while substantially retaining their order and arrangement, said means including magnetic means for driving by magnetic poles at least one selected bubble domain of said group of bubble domains during a given orientation of said magnetic field while non-selected bubble domains in said group are driven by bubble-bubble repulsion, and further means for directly driving said non-selected bubble domains in said two-dimensional group by magnetic poles during another orientation of said magnetic field.

13. The apparatus of claim 12, where said magnetic means are comprised of chevron shaped magnetic elements along which first magnetic poles are produced for directly driving said at least one selected bubble domain during a first orientation of said magnetic field and along which second magnetic poles are produced for directly driving said non-selected bubble domains during other orientation of said magnetic field.

14. The apparatus of claim 13, where said chevron elements are periodically arranged in an array.

15. The apparatus of claim 14, where said chevron elements are skewed.

16. The apparatus of claim 14, where the periodicity of said chevron elements in said array is an integral multiple of the periodicity of bubble domains in said lattice.

17. The apparatus of claim 14, where said lattice is comprised of rows and columns of hexagonally packed bubble domains and said chevron elements are arranged in rows and columns corresponding to the positions of selected rows and columns of said bubble domain lattice.

18. The apparatus of claim 14, wherein each chevron element drives bubble domains in at least two rows of said lattice.

19. The apparatus of claim 14, in which each chevron element drives bubble domains in at least two columns of said bubble domain lattice.

20. The apparatus of claim 12, in which said magnetic means are comprised of chevron elements arranged in a periodic array such that magnetic elements produced therealong by said magnetic field are closed to lattice points in said bubble domain lattice.

21. An apparatus for translating a two-dimensional lattice of interacting magnetic bubble domains in response to the reorientations of a magnetic field, comprisng:

a magnetic medium in which said bubble domains can be moved, and an array of magnetic elements where said elements are located in positions in said array to provide a substantially even spatial distribution of magnetic poles attractive to said bubble domains when said magnetic field is present, said magnetic elements having geometries and thicknesses to provide an array in which the driving forces on said bubble domains in said two-dimensional lattice are substantially the same during different orientations of said magnetic field to thereby translate said lattice while substantially maintaining its integrity.

22. The apparatus of claim 21, in which said magnetic elements have chevron shapes.

23. A structure for moving magnetic bubble domains arranged in a two-dimensional lattice of interacting bubble domains in response to the reorientation of a magnetic field, said two-dimensional lattice being comprised of rows and columns of bubble domains, comprising:

a magnetic medium in which said bubble domains can be moved, an array of periodically arranged chevron magnetic elements along which magnetic poles are produced in response to the different orientations of said magnetic field, said array comprising chevron magnetic elements for moving a column of bubble domains in said two-dimensional lattice while maintaining the integrity of said lattice.

24. The structure of claim 23, where said array of chevron magnetic elements is arranged in periodic rows and columns.

* * * * *

UNITED STATES PATENT AND TRADEMARK OFFICE
CERTIFICATE OF CORRECTION

PATENT NO. : 4,067,002
DATED : January 3, 1978
INVENTOR(S) : Hsu Chang

It is certified that error appears in the above-identified patent and that said Letters Patent are hereby corrected as shown below:

Column 3, line 68, "pulled" should read --pulsed--.

Column 4, line 56, "Inn" should read --In--.

Column 5, line 58, "pattrn" should read --pattern--.

Column 8, line 47, after "is" insert --a--.

Column 10, line 19, "basis" should read --bias--.

Column 13, line 31, "of the apex" should read --at the apex--.

Column 16, line 12, after "said" insert --two-dimensional--.

Signed and Sealed this

Twenty-seventh Day of June 1978

[SEAL]

Attest:

RUTH C. MASON
Attesting Officer

DONALD W. BANNER
Commissioner of Patents and Trademarks